US010347165B2

(12) United States Patent
Moon et al.

(10) Patent No.: US 10,347,165 B2
(45) Date of Patent: Jul. 9, 2019

(54) ORGANIC LIGHT EMITTING DISPLAY PANEL

(71) Applicant: Samsung Display Co., Ltd., Yongin-si, Gyeonggi-do (KR)

(72) Inventors: Jeong-Woo Moon, Suwon-si (KR); Jin-Koo Chung, Suwon-si (KR); Seong-Min Kim, Yongin-si (KR); Jin-Hyun Park, Yongin-si (KR); Chaun-Gi Choi, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/640,877

(22) Filed: Jul. 3, 2017

(65) Prior Publication Data

US 2018/0005561 A1 Jan. 4, 2018

(30) Foreign Application Priority Data

Jul. 4, 2016 (KR) ........................ 10-2016-0084179

(51) Int. Cl.
*G09G 3/20* (2006.01)
*G09G 3/3233* (2016.01)
(Continued)

(52) U.S. Cl.
CPC ......... *G09G 3/2003* (2013.01); *G09G 3/2074* (2013.01); *G09G 3/3208* (2013.01); *G09G 3/3233* (2013.01); *H01L 27/3216* (2013.01); *H01L 51/5012* (2013.01); *H01L 51/5206* (2013.01); *H01L 51/56* (2013.01); *G09G 2300/0452* (2013.01); *G09G 2340/0457* (2013.01); *H01L 27/322* (2013.01);
(Continued)

(58) Field of Classification Search
CPC ............. H01L 27/3218; H01L 27/3216; H01L 2251/5323; H01L 27/3267; H01L 51/5293; G09G 3/3233; G09G 2300/046; G02F 1/133512
See application file for complete search history.

(56) References Cited

U.S. PATENT DOCUMENTS

2009/0121983 A1* 5/2009 Sung .................. H01L 27/3216 345/76
2015/0168776 A1* 6/2015 Song .................. H01L 51/5281 349/62
2015/0194634 A1* 7/2015 Kang ................. H01L 51/5268 257/40

FOREIGN PATENT DOCUMENTS

KR 10-2006-0070836 A 12/2004
KR 10-2010-0105431 A 9/2010
(Continued)

*Primary Examiner* — Gerald Johnson
(74) *Attorney, Agent, or Firm* — Innovation Counsel LLP

(57) ABSTRACT

An OLED panel may include a substrate including a first region and a second region disposed along a first direction. A plurality of first pixels are disposed in the first region on the substrate, the first pixels each having a first area, the first pixels each comprising a first unit pixel, a second unit pixel disposed along a second direction from the first unit pixel, and a transmission portion disposed along the first direction from the first unit pixel and the second unit pixel. A plurality of second pixels are disposed in the second region on the substrate, the second pixels each having a second area less than the first area, the second pixels each comprising a third unit pixel. The first unit pixel, the second unit pixel, and the third unit pixel may have substantially the same shape as each other.

20 Claims, 15 Drawing Sheets

(51) Int. Cl.

| | |
|---|---|
| ***H01L 27/32*** | (2006.01) |
| ***H01L 51/50*** | (2006.01) |
| ***H01L 51/52*** | (2006.01) |
| ***H01L 51/56*** | (2006.01) |
| ***G09G 3/3208*** | (2016.01) |

(52) U.S. Cl.
CPC ...... *H01L 27/3276* (2013.01); *H01L 27/3288* (2013.01); *H01L 2227/323* (2013.01)

(56) References Cited

FOREIGN PATENT DOCUMENTS

| | | | |
|---|---|---|---|
| KR | 10-2012-0052206 | A | 5/2012 |
| KR | 101275810 | B1 | 6/2013 |
| KR | 10-2015-0011694 | A | 2/2015 |

* cited by examiner

I
II
211
212
220
310
170
160
150
130
140
120
110
10

I
II
211
212
220
310
55
50
170
160
150
130
140
120
110
10

I
II
211
212
220
310
60
170
160
150
130
140
120
110
10

ORGANIC LIGHT EMITTING DISPLAY PANEL

CROSS-REFERENCE TO RELATED APPLICATION(S)

This application claims priority under 35 USC § 119 to Korean Patent Application No. 10-2016-0084179, filed on Jul. 4, 2016 in the Korean Intellectual Property Office (KIPO), the entire disclosure of which is incorporated by reference herein.

BACKGROUND

1. Field

Exemplary embodiments relate to display panels. More particularly, exemplary embodiments relate to organic light emitting display (OLED) panels having a plurality of resolutions.

2. Description of the Related Art

Recently, interests in a transparent display device including a transparent display panel have been increasing. Generally, the transparent display panel may include a plurality of pixels, each of the pixels may include a light emitting portion and a light transmittance portion.

An increase of the resolution of the display device may be required for the implementation of the display device with high quality image. To increase the resolution of the display device while maintaining the same screen size, the area of the pixel may decrease.

There is a tradeoff between a resolution and a light transmittance of the transparent display device. Therefore, it is hard to implement a high resolution and a high light transmittance simultaneously.

SUMMARY

A feature of the inventive concept is to provide an organic light emitting display (OLED) panel having a high light transmittance as well as a high resolution.

Another feature of the inventive concept is to provide an OLED panel in which manufacturing cost and time of an organic light emitting layer are reduced.

An OLED panel according to exemplary embodiments may include a substrate comprising a first region and a second region disposed along a first direction. A plurality of first pixels are disposed in the first region on the substrate, the plurality of first pixels each having a first area, the plurality of first pixels each comprising a first unit pixel, a second unit pixel disposed along a second direction perpendicular to the first direction from the first unit pixel, and a transmission portion disposed along the first direction from the first unit pixel and the second unit pixel. A plurality of second pixels are disposed in the second region on the substrate, the plurality of second pixels each having a second area less than the first area, the plurality of second pixels each comprising a third unit pixel. The first unit pixel, the second unit pixel, and the third unit pixel may have substantially the same shape as each other.

In an exemplary embodiment, the first unit pixel and the second unit pixel may share a pixel circuit.

In an exemplary embodiment, each of the first unit pixel, the second unit pixel, and the third unit pixel may include a first sub-pixel, a second sub-pixel, and a third sub-pixel.

In an exemplary embodiment, the second sub-pixel and the third sub-pixel may be disposed along the first direction from the first sub-pixel, and may be arranged along the second direction.

In an exemplary embodiment, the first sub-pixel, the second sub-pixel, and the third sub-pixel may be a blue sub-pixel, a red sub-pixel, and a green sub-pixel, respectively.

In an exemplary embodiment, the first area may be four times greater than the second area.

In an exemplary embodiment, an area of the transmission portion may be substantially equal to a sum of an area of the first unit pixel and an area of the second unit pixel.

In another exemplary embodiment, an area of the transmission portion may be greater than a sum of an area of the first unit pixel and an area of the second unit pixel.

In an exemplary embodiment, the OLED panel may further include a first signal line extending along the first direction, the first signal line being connected to second pixels in 2N−1 pixel columns among the plurality of second pixels and configured to transmit a first driving signal; and a second signal line extending along the first direction, the second signal line being connected to second pixels in 2N pixel columns among the plurality of second pixels and configured to transmit a second driving signal, where N is an integer.

In an exemplary embodiment, the first signal line may be connected to the plurality of first pixels. The plurality of first pixels may be configured to be driven based on the first driving signal.

In another exemplary embodiment, the first signal line and the second signal line may be connected to the plurality of first pixels. The plurality of first pixels may be configured to be driven based on the first driving signal and the second driving signal.

In an exemplary embodiment, a shielding member may be disposed in a first peripheral region surrounding the first unit pixel, the second unit pixel, and the transmission portion and in a second peripheral region surrounding the third unit pixel.

In an exemplary embodiment, a polarizing member may be disposed in the second region.

An OLED device according to some exemplary embodiments may include a substrate comprising a first region and a second region disposed along a first direction. A plurality of first pixels are disposed in the first region on the substrate, the plurality of first pixels each having a first area, the plurality of first pixels each comprising a first unit pixel, a second unit pixel disposed along a second direction perpendicular to the first direction from the first unit pixel, and a transmission portion disposed along the first direction from the first unit pixel and the second unit pixel. A plurality of second pixels are disposed in the second region on the substrate, the plurality of second pixels each having a second area less than the first area, the plurality of second pixels each comprising a third unit pixel. A pixel electrode is disposed in each of the first unit pixel, the second unit pixel, and the third unit pixel. A common electrode faces the pixel electrode. An organic light emitting layer is disposed between the pixel electrode and the common electrode, the organic light emitting layer disposed corresponding to each of the first unit pixel, the second unit pixel, the third unit pixel, and the transmission portion.

In an exemplary embodiment, each of the first unit pixel, the second unit pixel, and the third unit pixel may include a first sub-pixel, a second sub-pixel, and a third sub-pixel. The pixel electrode may be disposed corresponding to each of the first sub-pixel, the second sub-pixel, and the third sub-pixel. The organic light emitting layer may be disposed corresponding to each of the first sub-pixel, the second sub-pixel, and the third sub-pixel.

In an exemplary embodiment, the second sub-pixel and the third sub-pixel may be disposed along the first direction from the first sub-pixel, and may be arranged along the second direction. The organic light emitting layer disposed corresponding to each of the first sub-pixel of the first unit pixel and the first sub-pixel of the second unit pixel may be integrally formed.

In an exemplary embodiment, the pixel electrode disposed corresponding to each of the first sub-pixel of the first unit pixel and the first sub-pixel of the second unit pixel may be integrally formed.

In an exemplary embodiment, the organic light emitting layer disposed corresponding to each of the first unit pixel, the second unit pixel, the third unit pixel, and the transmission portion may have substantially the same shape.

In an exemplary embodiment, the organic light emitting layer disposed corresponding to each of the first unit pixel, the second unit pixel, the third unit pixel, and the transmission portion may be formed by using substantially the same mask.

In an exemplary embodiment, the organic light emitting layer may be configured to transmit light.

The OLED panel according to exemplary embodiments may include the plurality of first pixels disposed in a low resolution region, each of the first pixels including the first unit pixel, the second unit pixel, and the transmission portion and the plurality of second pixels disposed in a high resolution region, each of the second pixels including the third unit pixel. The OLED panel may function as a transparent display panel in the low resolution region, and may function as an opaque display panel in the high resolution region. Further, the OLED panel according to exemplary embodiments may include the organic light emitting layer having substantially the same shape in the low resolution region and the high resolution region, so that substantially the same mask may be used to form the organic light emitting layer, and manufacturing cost and time of the OLED panel may be reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, an organic light emitting display (OLED) panel in accordance with exemplary embodiments will be explained in detail with reference to the accompanying drawings.

Figure 1:
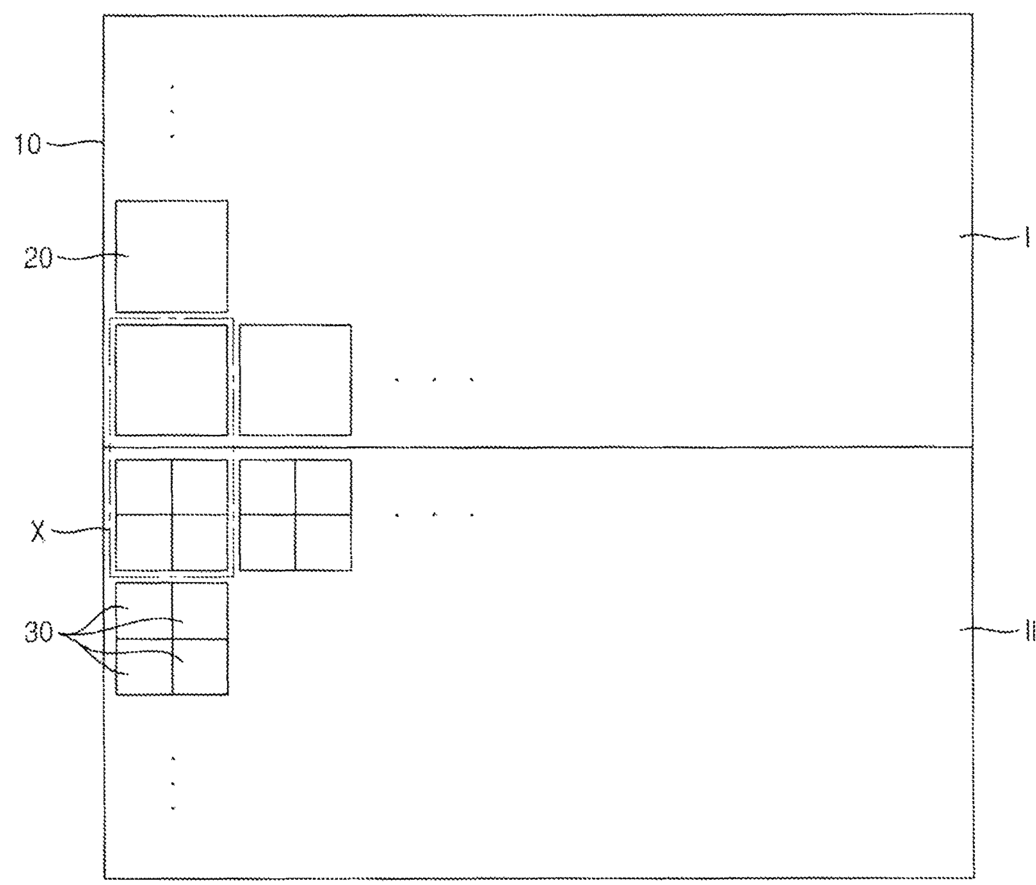
FIG. 1 is a plan view illustrating an OLED panel according to exemplary embodiments.
Figure 1:
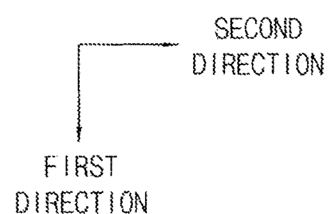

FIG. 1 is a plan view illustrating an OLED panel 1 according to exemplary embodiments.

Referring to FIG. 1, the OLED panel 1 may include a substrate 10, a plurality of first pixels 20, and a plurality of second pixels 30. The first pixels 20 and the second pixels 30 may be disposed on the substrate 10.

The OLED panel 1 may be divided into a first region I and a second region II. For example, the first region I may be a low resolution region, and the second region II may be a high resolution region. The low resolution region and the high resolution region may be differentiated by a size of a pixel disposed in each of the low resolution region and the high resolution region. In an exemplary embodiment, the low resolution region may display less important information, and the high resolution region may display relatively more important information such as an important text and a detailed image. Further, the first region I may be a transparent region in which a user may observe an object disposed on an opposite side through transmitted external light, and the second region II may be an opaque region in which the external light may be blocked. Here, the first region I and the second region II may be disposed along a first direction. In other words, the first region I and the second region II may be adjacent along the first direction, and may extend along a second direction which is substantially perpendicular to the first direction.

The first pixels 20 may be disposed in the first region I. Each of the first pixels 20 may have a first area. The second pixels 30 may be disposed in the second region II. Each of the second pixels 30 may have a second area which is less than the first area. In an exemplary embodiment, the first area may be substantially four times greater than the second area. For example, an area of one first pixel 20 may be substantially the same as areas of four second pixels 30 as illustrated in FIG. 1.

Figure 2:
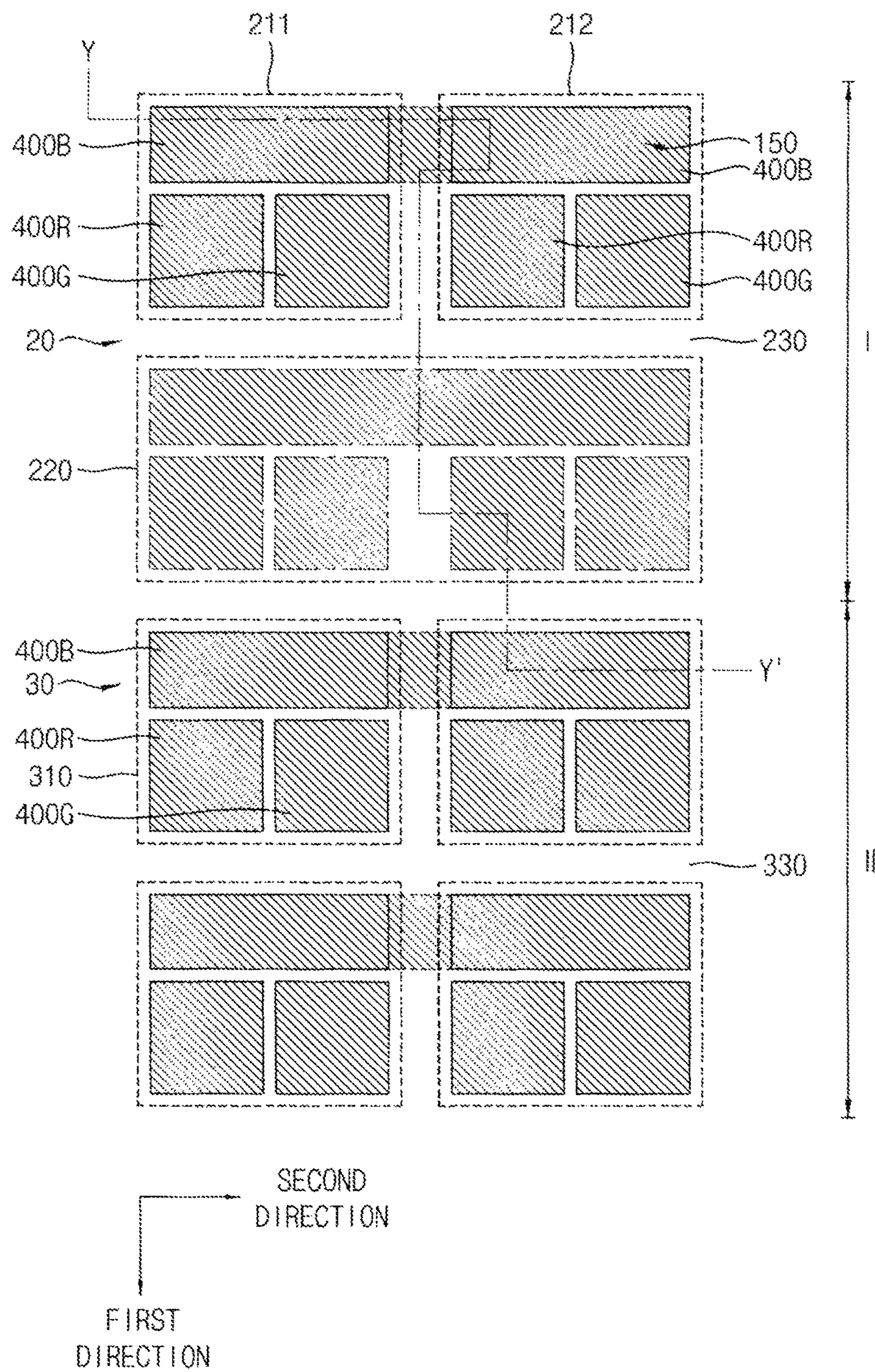
FIG. 2 is a plan view illustrating an example of an area X in FIG. 1.

FIG. 2 is a plan view illustrating an example of an area X in FIG. 1.

Referring to FIG. 2, the first pixel 20 may include a first unit pixel 211, a second unit pixel 212, and a transmission portion 220. The second pixel 30 may include a third unit pixel 310.

Each of the first unit pixel 211 and the second unit pixel 212 may emit light which may compose an image displayed from the first region I. The third unit pixel 310 may emit light which may compose an image displayed from the second region II. The transmission portion 220 may transmit external light so that a user may observe an object disposed on an opposite side in the first region I. A first peripheral region 230 which surrounds the first unit pixel 211, the second unit pixel 212, and the transmission portion 220 may be defined in the first region I. A second peripheral region 330 which surrounds the third unit pixel 310 may be defined in the second region II.

The second unit pixel 212 may be disposed in the second direction from the first unit pixel 211. The transmission portion 220 may be disposed in the first direction from the first unit pixel 211 and the second unit pixel 212.

The first unit pixel 211, the second unit pixel 212, and the third unit pixel 310 may have substantially the same shape with each other. Therefore, the first unit pixel 211, the second unit pixel 212, and the third unit pixel 310 may have substantially the same area with each other. FIG. 2 illustrates that each of the first unit pixel 211, the second unit pixel 212, and the third unit pixel 310 has a rectangular shape. However, the embodiments are not limited thereto. Each of the first unit pixel 211, the second unit pixel 212, and the third unit pixel 310 may have polygonal shapes other than the rectangular shape.

In an exemplary embodiment, an area of the transmission region 220 may be substantially the same as a sum of an area of the first unit pixel 211 and an area of the second unit pixel 212. For example, a shape of the transmission portion 220 may correspond to a shape which is a combination of the first unit pixel 211 and the second unit pixel 212 adjacent to each other in the second direction.

In an exemplary embodiment, each of the first unit pixel 211, the second unit pixel 212, and the third unit pixel 310 may have a first sub-pixel 400B, a second sub-pixel 400R, and a third sub-pixel 400G. The first sub-pixel 400B, the second sub-pixel 400R, and the third sub-pixel 400G may emit lights having different colors from each other, and the lights may be combined to display one color. For example, the first sub-pixel 400B, the second sub-pixel 400R, and the third sub-pixel 400G may correspond to a blue sub-pixel, a red sub-pixel, and a green sub-pixel, respectively.

In an exemplary embodiment, the second sub-pixel 400R and the third sub-pixel 400G may be disposed in the first direction from the first sub-pixel 400B, and the second sub-pixel 400R and the third sub-pixel 400G may be adjacent to each other along the second direction. Each of the first sub-pixel 400B, the second sub-pixel 400R, and the third sub-pixel 400G may be defined by a pixel electrode 140 in FIG. 4. In other words, each of the sub-pixels 400B, 400R, and 400G may be defined by the pixel electrode 140 disposed on the substrate 10. The pixel electrode 140 will be described below with reference to FIG. 4.

In an exemplary embodiment, the first unit pixel 211 and the second unit pixel 212 may display substantially the same color with each other. In an embodiment, the first unit pixel 211 and the second unit pixel 212 may be electrically connected to each other. In another embodiment, the first unit pixel 211 and the second unit pixel 212 may share a pixel circuit. For example, the first sub-pixel 400B, the second sub-pixel 400R, and the third sub-pixel 400G included in the first unit pixel 211 may emit lights having luminances substantially the same as those of the first sub-pixel 400B, the second sub-pixel 400R, and the third sub-pixel 400G included in the second unit pixel 212, respectively. Therefore, a light emitting area of the first pixel 20 may be two times greater than a light emitting area of the second pixel 30.

Figure 3:
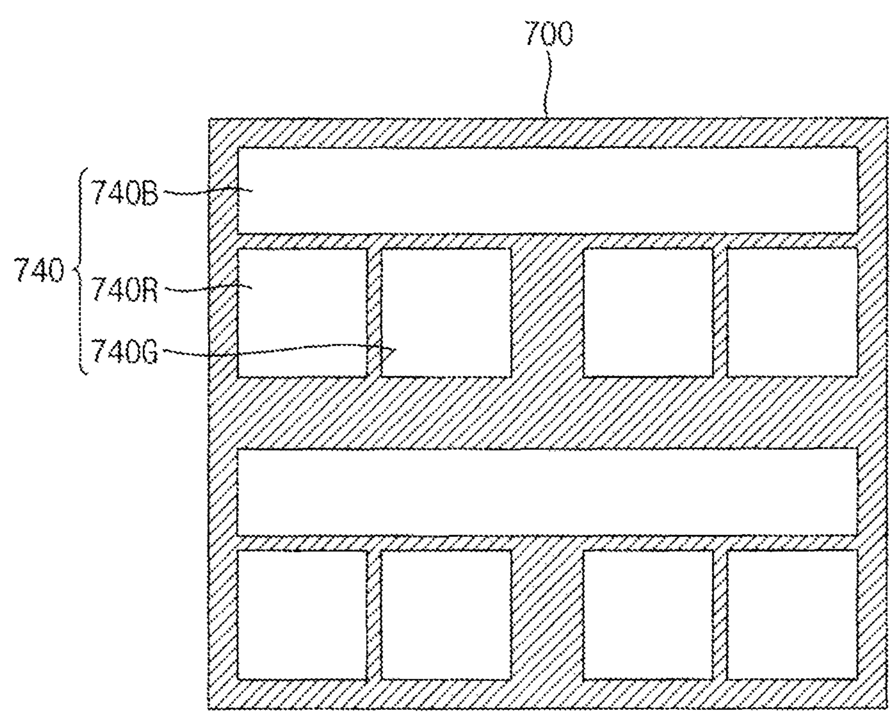
FIG. 3 is a plan view illustrating a mask used to form an organic light emitting layer in FIG. 2.

FIG. 3 is a plan view illustrating a mask used to form an organic light emitting layer 150 in FIG. 2.

Referring to FIGS. 2 and 3, the organic light emitting layer 150, represented by the shaded portions in FIG. 2, may be formed in regions corresponding to the first unit pixel 211, the second unit pixel 212, the third unit pixel 310, and the transmission portion 220. The organic light emitting layer 150 may be formed on the pixel electrode 140. For example, the organic light emitting layer 150 may be formed corresponding to the first sub-pixel 400B, the second sub-pixel 400R, and the third sub-pixel 400G included in each of the first unit pixel 211, the second unit pixel 212, and the third unit pixel 310. Thus, an image may be displayed by light emitted from the organic light emitting layer 150. Further, the organic light emitting layer 150 may be formed in the transmission portion 220. Here, a shape of the organic light emitting layer 150 formed in the transmission portion 220 may be substantially the same as a shape of the organic light emitting layer 150 formed in each of the first unit pixel 211 and the second unit pixel 212.

In an exemplary embodiment, the organic light emitting layer 150 formed in the first sub-pixel 400B of the first unit pixel 211 and the first sub-pixel 400B of the second unit pixel 212 may be integrally formed. For example, as illustrated in FIG. 2, the organic light emitting layer 150 may extend along the second direction, and may be formed integrally for the first sub-pixel 400B of the first unit pixel 211 and the first sub-pixel 400B of the second unit pixel 212.

In an exemplary embodiment, the organic light emitting layer 150 formed in the first and second unit pixels 211 and 212, the organic light emitting layer 150 formed in the transmission portion 220, and the organic light emitting layer 150 formed in the third unit pixel 310, which are adjacent to each other in the second direction, may have substantially the same shape with each other.

The organic light emitting layer 150 may be formed by using a mask 700. For example, the mask 700 may be fine metal mask (FMM). The mask 700 may include a opening portion 740. The opening portion 740 may include a first opening portion 740B, a second opening portion 740R, and a third opening portion 740G. For example, a blue organic light emitting material may be injected through the first opening portion 740B, a red organic light emitting material may be injected through the second opening portion 740R, and a green organic light emitting material may be injected through the third opening portion 740G.

In an exemplary embodiment, one mask 700 may be used to form the organic light emitting layer 150 in the first region I and the second region II. As illustrated in FIG. 3, the organic light emitting layer 150 may be formed in one first pixel 20 in the first region I, or the organic light emitting layer 150 may be formed in four second pixels 30 in the second region II when using four opening portions 740 of the mask 700. Here, the organic light emitting layer 150 may be formed in the transmission portion 220 as well as in the first unit pixel 211 and the second unit pixel 212.

In an exemplary embodiment, as illustrated in FIG. 3, the first opening portions 740B which are adjacent to each other in the second direction, may be integrally formed. Therefore, as illustrated in FIG. 2, the organic light emitting layer 150 which has a shape corresponding to a shape of the opening portion 740 may be formed.

In an exemplary embodiment, the first region I may be a transparent region, and more than a certain level of light transmittance and haze against external light may be required in the transparent region. In a comparative example, an organic light emitting layer may not be formed in a transmission region, and external light may transmit through the transmission region without passing through the organic light emitting layer. Therefore, in the comparative example, more than a certain level of light transmittance and haze against external light may be accomplished. In the exemplary embodiment, light transmittance and haze may not be reduced dramatically as illustrated in Table 1 although the organic light emitting layer 150 is formed in the transmission portion 220. Therefore, proper level of light transmittance and haze against external light may be accomplished, and the first region I may function as a transparent region.

TABLE 1

| | relative light transmittance | relative haze |
|---|---|---|
| comparative example | 100% | 100% |
| exemplary embodiment | 99.6% | 95.8% |

Although the first pixel 20 and the second pixel 30 disposed in the first region I and the second region II, respectively, have different areas than each other, and the first pixel 20 includes the transmission portion 220, one mask 700 may be used to form the organic light emitting layer 150. Therefore, manufacturing cost and time of the OLED panel 1 may be reduced.

Figure 4:
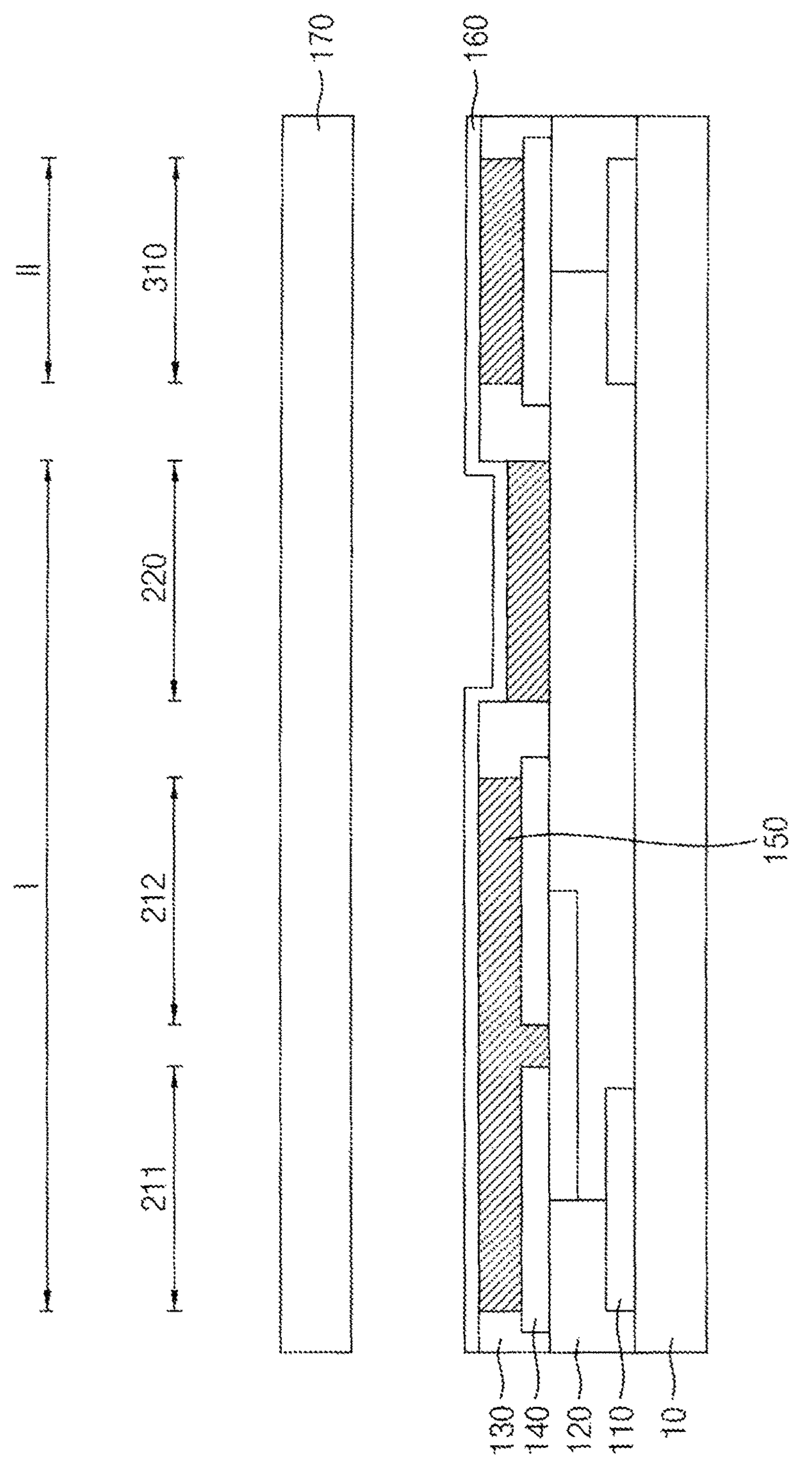
FIG. 4 is a cross-sectional view illustrating an OLED panel cut along a line Y-Y' in FIG. 2.

FIG. 4 is a cross-sectional view illustrating an OLED panel cut along a line Y-Y' in FIG. 2.

Referring to FIG. 4, the OLED panel 1 may include the substrate 10, a pixel circuit 110, an insulation structure 120, the pixel electrode 140, the organic light emitting layer 150, a common electrode 160, and an encapsulation substrate 170.

The substrate 10 may include a transparent insulation material such as polyimide-based resin. In this case, the substrate 10 may not substantially reduce light transmittance of the OLED panel 1, and may have relatively high mechanical strength. In an exemplary embodiment, the substrate 10 may include a flexible substrate including glass, plastic, or the like and having flexible characteristic.

The pixel circuit 110 may be formed on the substrate 10. The pixel circuit 110 may transmit a driving current to the pixel electrode 140 based on a driving signal so as to emit light from the organic light emitting layer 150. The pixel circuit 110 may include a transistor and a capacitor. For example, the pixel circuit 110 formed in the first region I may be connected to the pixel electrode 140 corresponding to each sub-pixel 400B, 400R, and 400G included in the first unit pixel 211 and the pixel electrode 140 corresponding to each sub-pixel 400B, 400R, and 400G included in the second unit pixel 212 as illustrated in FIG. 4. In this case, the pixel electrode 140 corresponding to each sub-pixel 400B, 400R, and 400G included in the first unit pixel 211 and the pixel electrode 140 corresponding to each sub-pixel 400B, 400R, and 400G included in the second unit pixel 212 may receive substantially the same driving current from the pixel circuit 110. In other words, each sub-pixel 400B, 400R, and 400G included in the first unit pixel 211 and each sub-pixel 400B, 400R, and 400G included in the second unit pixel 212 may share the pixel circuit 110. Moreover, the pixel circuit 110 formed in the second region II may be connected to the pixel electrode 140 corresponding to each sub-pixel 400B, 400R, and 400G included in the third unit pixel 310.

The insulation structure 120 may be formed on the substrate 10 to cover the pixel circuit 110. For example, the insulation structure 120 may be formed of an inorganic material such as silicon oxide, silicon nitride, silicon oxynitride, aluminum oxide, aluminum nitride, titanium oxide, and/or titanium nitride, or an organic material such as polyimide, polyester, and/or acryl. For example, the insulation structure 120 may include a plurality of insulation layers.

The pixel electrode 140 may be formed on the insulation structure 120. As described above, the pixel electrode 140 may be independently formed corresponding to each of the first to third sub-pixels 400B, 400R, and 400G.

A pixel defining layer 130 may be formed on the insulation structure 120. The pixel defining layer 130 may cover an edge portion of the pixel electrode 140. In an embodiment, the pixel defining layer 130 may be formed in the transmission portion 220. In another embodiment, the pixel defining layer 130 in the transmission portion 220 may be removed to improve light transmittance in the transmission portion 220 as illustrated in FIG. 4.

The organic light emitting layer 150 may be formed on the pixel electrode 140. The organic light emitting layer 150 may be formed corresponding to each of the first unit pixel 211, the second unit pixel 212, the third unit pixel 310, and the transmission portion 220. In an exemplary embodiment, the organic light emitting layer 150 may be formed per each of the first to third sub-pixels 400B, 400R, and 400G. In another exemplary embodiment, the organic light emitting layer 150 may be integrally formed in the first sub-pixels 400B adjacent to each other.

As described above with reference to FIG. 3, the organic light emitting layer 150 may be formed by using one mask. Therefore, the organic light emitting layer 150 may be formed in the transmission portion 220.

The organic light emitting layer 150 may transmit light. For example, the organic light emitting layer 150 may transmit external light incident onto the OLED panel 1. Therefore, a user may recognize an object disposed at an opposite side with respect to the OLED panel 1 through external light passing through the transmission portion 220 although the organic light emitting layer 150 is formed in the transmission portion 220.

The common electrode 160 may be formed on the organic light emitting layer 150 and the pixel defining layer 130. The common electrode 160 may face the pixel electrode 140 with respect to the organic light emitting layer 150. For example, the common electrode 160 may be commonly formed in the first unit pixel 211, the second unit pixel 212, the third unit pixel 310, and the transmission portion 220.

Although it is not illustrated in FIG. 4, a hole injection layer (HIL), a hole transport layer (HTL), etc. may be additionally formed between the pixel electrode 140 and the organic light emitting layer 150, and an electron transport layer (ETL), an electron injection layer (EIL), etc. may be additionally formed between the organic light emitting layer 150 and the common electrode 160. For example, the HIL, the HTL, the ETL, and the EIL may be commonly formed in the first unit pixel 211, the second unit pixel 212, the third unit pixel 310, and the transmission portion 220.

The encapsulation substrate 170 may be formed over the common electrode 160 to face the substrate 10. The encapsulation substrate 170 may include a transparent insulation material such as polyimide-based resin. In this case, the encapsulation substrate 170 may not substantially reduce light transmittance of the OLED panel 1, and may have relatively high mechanical strength. In an exemplary embodiment, the encapsulation substrate 170 may include a flexible substrate including glass, plastic, or the like and having flexible characteristic.

Figure 5:
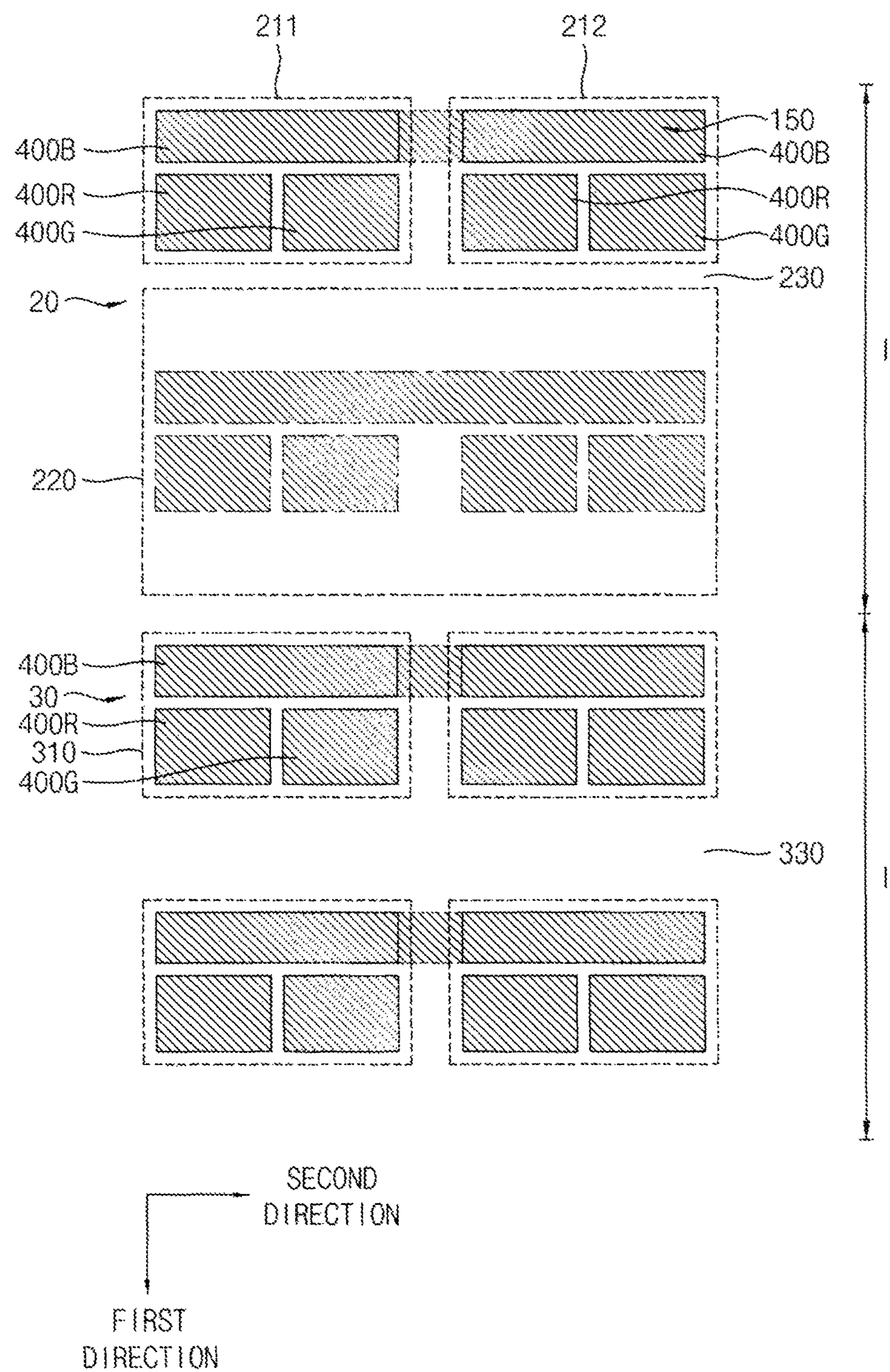
FIG. 5 is a plan view illustrating another example of an area X in FIG. 1.

FIG. 5 is a plan view illustrating another example of an area X in FIG. 1.

Referring to FIGS. 1 and 5, an OLED panel 1 may include a plurality of first pixels 20 disposed in a first region I and a plurality of second pixels 30 disposed in a second region II. Each of the first pixels 20 may include a first unit pixel 211, a second unit pixel 212, and a transmission portion 220. Each of the second pixels 30 may include a third unit pixel 310.

The OLED panel 1 illustrated in FIG. 5 may have elements and/or constructions substantially the same as or similar to the OLED panel 1 illustrated in FIG. 2 except for the areas of the first unit pixel 211, the second unit pixel 212, the third unit pixel 310, and the transmission portion 220. Therefore, detailed descriptions of the repeated elements and/or constructions are omitted, and like reference numerals are used to designate like elements.

The first unit pixel 211, the second unit pixel 212, and the third unit pixel 310 may have substantially the same shape with each other, and may have substantially the same area with each other.

In another exemplary embodiment, the area of the transmission portion 220 may be greater than the sum of an area of the first unit pixel 211 and an area of the second unit pixel 212. Here, an area of the first pixel 20 illustrated in FIG. 5 is substantially the same as the area of the first pixel 20 illustrated in FIG. 2. Thus, the area of the first unit pixel 211 and the area of the second unit pixel 212 may relatively decrease, and the area of the transmission portion 220 may relatively increase. Therefore, the light transmittance in the first region I may be improved. Further, an area of the third unit pixel 310 illustrated in FIG. 5 may decrease in comparison with the area of the third unit pixel 310 illustrated in FIG. 2.

Comparing the OLED panel 1 according to another exemplary embodiment illustrated in FIG. 5 with the OLED panel 1 according to an exemplary embodiment illustrated in FIG. 2, the areas of the first unit pixel 211, the second unit pixel 212, and the third unit pixel 310 may decrease. Therefore, light emitting areas in the first region I and the second region II may decrease, however, light transmittance in the first region I may increase since the area of the transmission portion 220 increases.

Figure 6:
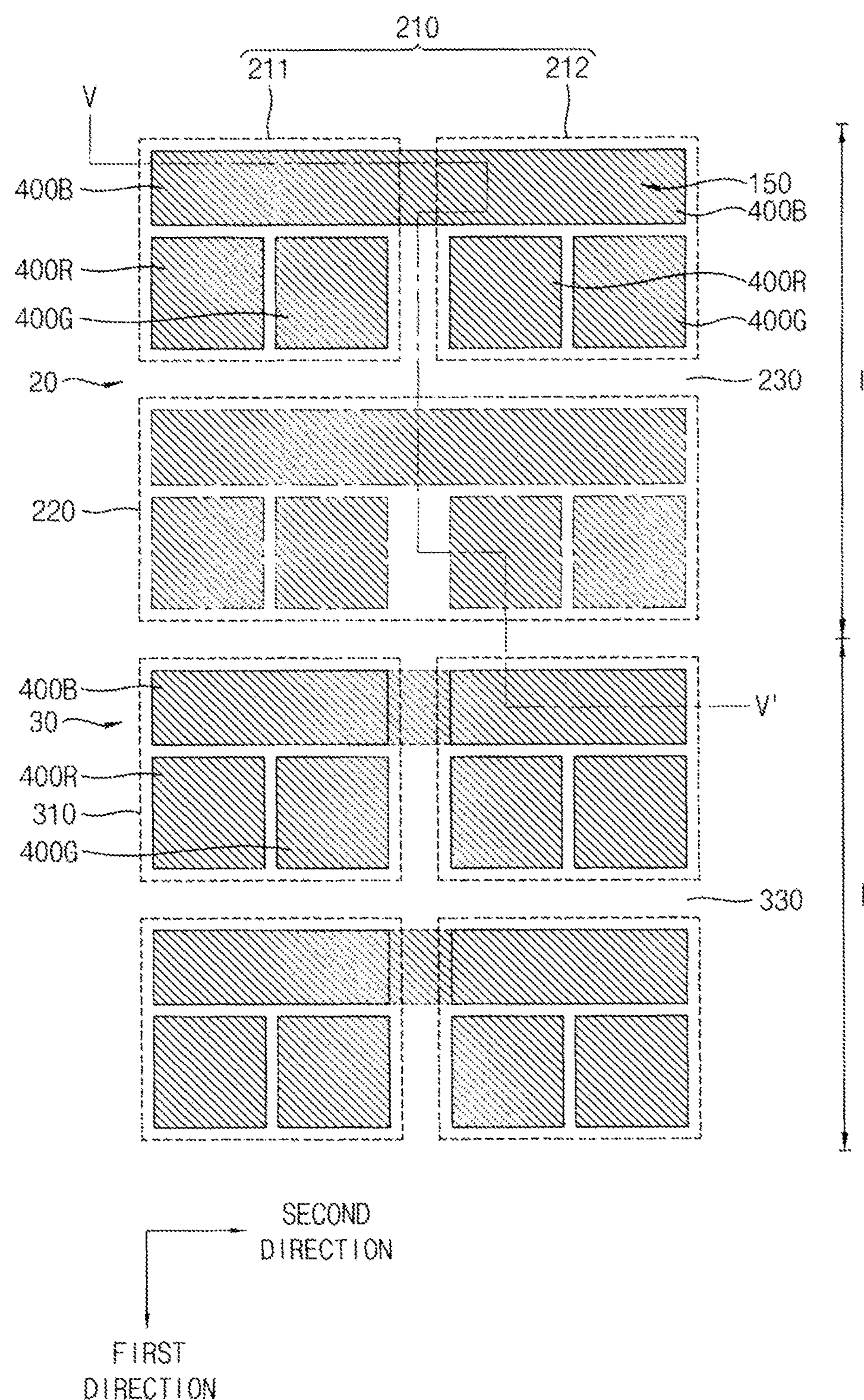
FIG. 6 is a plan view illustrating still another example of an area X in FIG. 1.
Figure 7:
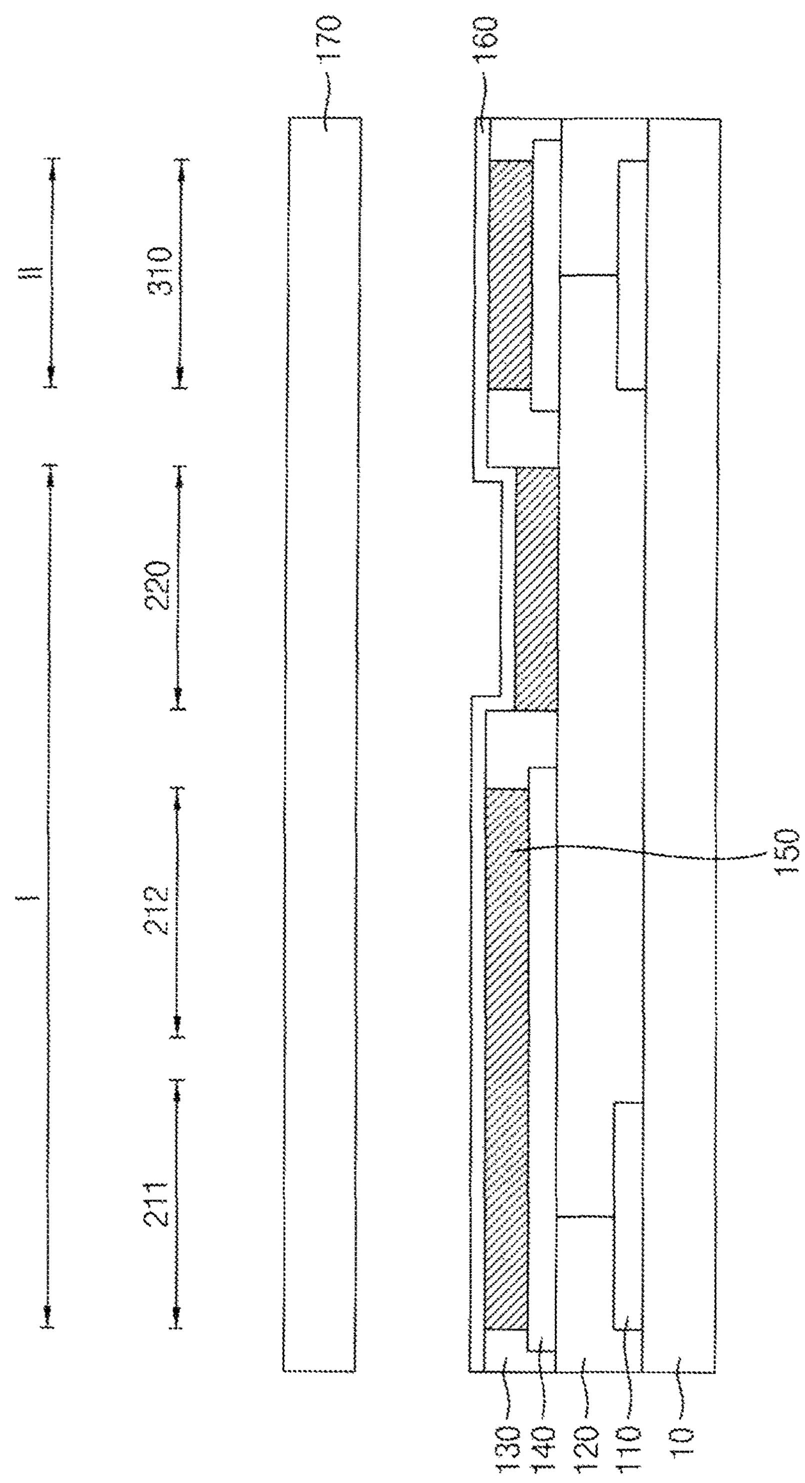
FIG. 7 is a cross-sectional view illustrating an OLED panel cut along a line V-V' in FIG. 6.

FIG. 6 is a plan view illustrating still another example of an area X in FIG. 1. FIG. 7 is a cross-sectional view illustrating an OLED panel cut along a line V-V' in FIG. 6.

Referring to FIGS. 1, 6, and 7, an OLED panel 1 may include a plurality of first pixels 20 disposed in a first region I and a plurality of second pixels 30 disposed in a second region II. Each of the first pixels 20 may include a first unit pixel 211, a second unit pixel 212, and a transmission portion 220. Each of the second pixels 30 may include a third unit pixel 310.

The OLED panel 1 illustrated in FIGS. 6 and 7 may have elements and/or constructions substantially the same as or similar to the OLED panel 1 illustrated in FIG. 2 except for the structures of the first sub-pixel 400B of the first unit pixel 211 and the first sub-pixel 400B of the second unit pixel 212. Therefore, detailed descriptions of the repeated elements and/or constructions are omitted, and like reference numerals are used to designate like elements.

The first unit pixel 211, the second unit pixel 212, and the third unit pixel 310 may have substantially the same shape with each other, and may have substantially the same area with each other.

Each of the first unit pixel 211, the second unit pixel 212, and the third unit pixel 310 may have a first sub-pixel 400B, a second sub-pixel 400R, and a third sub-pixel 400G. The first sub-pixel 400B, the second sub-pixel 400R, and the third sub-pixel 400G may emit lights having different colors from each other, and the lights may be combined to display one color.

In an exemplary embodiment, the pixel electrode 140 disposed corresponding to the first sub-pixel 400B of the first unit pixel 211 and the pixel electrode 140 disposed corresponding to the first sub-pixel 400B of the second unit pixel 212 may be integrally formed. For example, the pixel electrode 140 may extend along the second direction, and may be disposed commonly in the first sub-pixel 400B of the first unit pixel 211 and the first sub-pixel 400B of the second unit pixel 212 on the substrate 10. Further, the organic light emitting layer 150 may be formed corresponding to the pixel electrode 140. Therefore, an aperture ratio of the first sub-pixel 400B included in the first pixel 20 illustrated in FIG. 6 may increase in comparison with the first pixel 20 illustrated in FIG. 2.

In an embodiment, the first sub-pixel 400B, the second sub-pixel 400R, and the third sub-pixel 400G may correspond to a blue sub-pixel, a red sub-pixel, and a green sub-pixel, respectively. Generally, light efficiency of a blue organic light emitting material may be less than those of a red organic light emitting material or a green organic light emitting material. Thus, the lifespan of the blue organic light emitting material may be relatively short. When an aperture ratio of the first sub-pixel 400B which emits blue light increases, the first sub-pixel 400B may be driven with a relatively lower luminance, so that the lifespan of the first sub-pixel 400B may increase.

The shape and the area of the first sub-pixel 400B disposed in the first region I and the shape and the area of the first sub-pixel 400B disposed in the second region II may be different from each other. For example, the first sub-pixel 400B may extend along the second direction, and commonly formed for the first unit pixel 211 and the second unit pixel 212 in the first region I, However, the first sub-pixel 400B may be independently formed per the third unit pixel 310 in the second region II.

Figure 8:
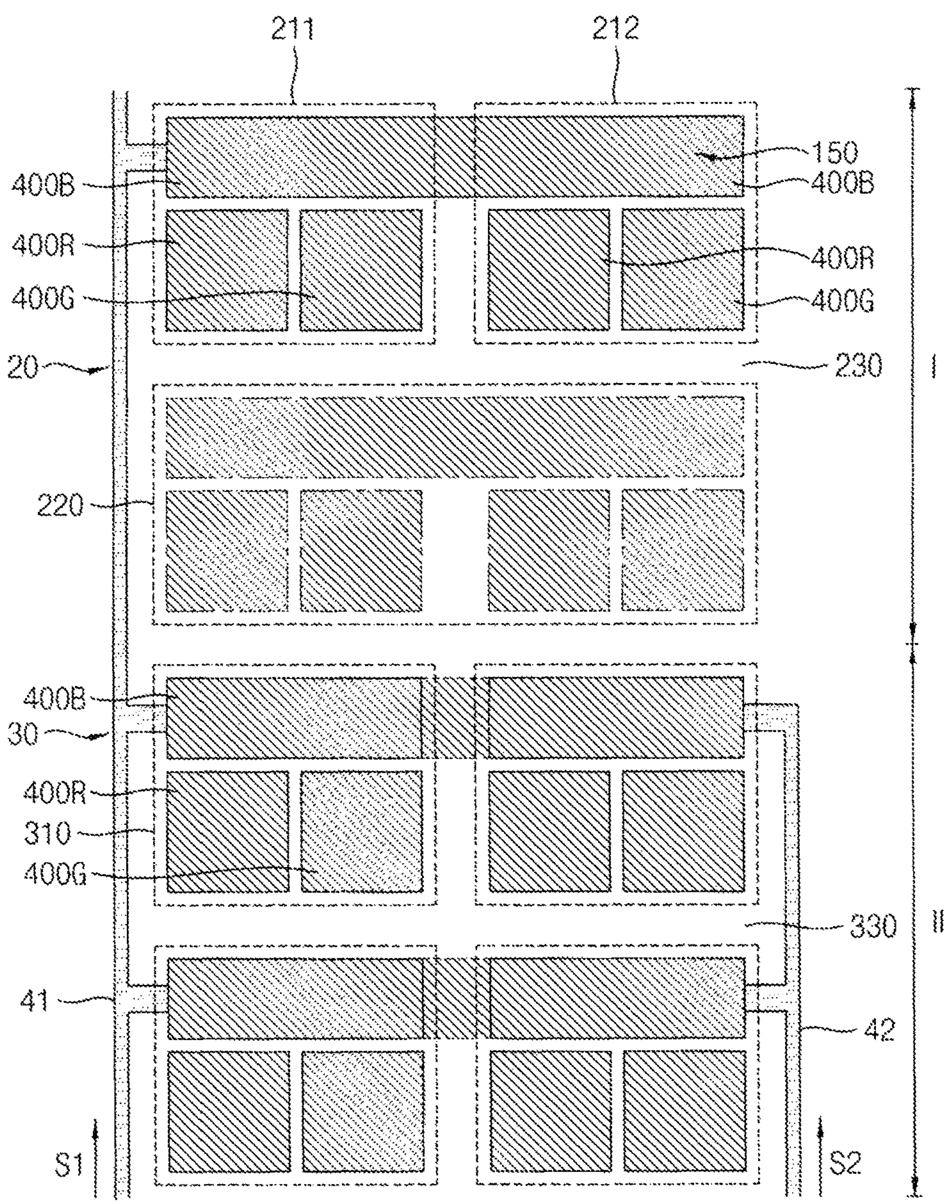
FIGS. 8 and 9 are plan views illustrating methods of driving first pixels and second pixels according to exemplary embodiments.
Figure 9:
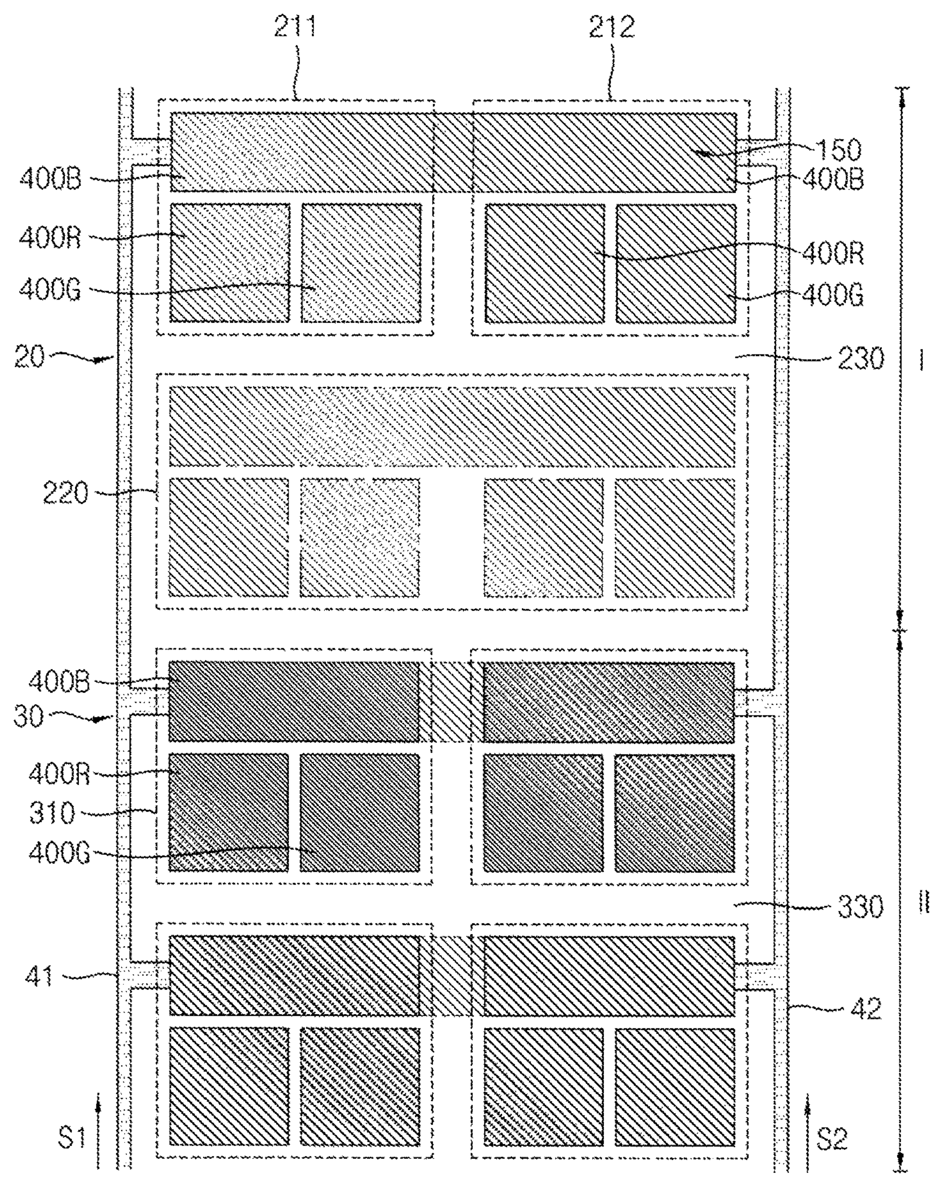

FIGS. 8 and 9 are plan views illustrating methods of driving first pixels 20 and second pixels 30 according to exemplary embodiments.

Referring to FIGS. 1, 8, and 9, an OLED panel 1 may include the plurality of first pixels 20 disposed in a first region I and the plurality of second pixels 30 disposed in a second region II. Each of the first pixels 20 may include a first unit pixel 211, a second unit pixel 212, and a transmission portion 220. Each of the second pixels 30 may include a third unit pixel 310.

The OLED panel 1 illustrated in FIGS. 8 and 9 may have elements and/or constructions substantially the same as or similar to the OLED panel 1 illustrated in FIG. 6 except for the addition of first signal lines 41 and second signal lines 42. Therefore, detailed descriptions of the repeated elements and/or constructions are omitted, and like reference numerals are used to designate like elements.

The OLED panel 1 may further include the first signal lines 41 and the second signal lines 42 which extend along the first direction. The first signal lines 41 may be connected to the second pixels 30 in 2N−1 pixel columns among the plurality of second pixels 30 to transmit a first driving signal S1. The second signal lines 42 may be connected to second pixels 30 in 2N pixel columns among the plurality of second pixels 30 to transmit a second driving signal S2. Here, N may be an integer. In other words, the first signal lines 41 may be connected to the second pixels 30 in odd pixel columns, and the second signal lines 42 may be connected to the second pixels 30 in even pixel columns.

Each of the second pixels 30 may be connected to the first signal line 41 or the second signal line 42, and may driven based on the first driving signal S1 or the second driving signal S2. For example, each of the first signal line 41 and the second signal line 42 may correspond to a data line, and each of the first driving signal S1 and the second driving signal S2 may correspond to a data signal.

As illustrated in FIG. 8, in an exemplary embodiment, each of the first pixels 20 may be connected to the first signal line 41, and may be driven based on the first driving signal S1. Here, the first signal lines 41 may transmit the first driving signal S1 to the second pixels 30 in the (2N−1) pixel columns among the plurality of second pixels 30 and to the first pixels 20. Further, the second signal lines 42 may transmit the second driving signal S2 to the second pixels 30 in the (2N) pixel columns among the plurality of second pixels 30. Therefore, the first pixels 20 may be connected to the first signal line 41, and may not be connected to the second signal line 42. Further, the first pixels 20 may be driven based on only the first driving signal S1.

As illustrated in FIG. 9, in another exemplary embodiment, each of the first pixels 20 may be connected to the first signal line 41 and the second signal line 42, and may be driven based on the first driving signal S1 and the second driving signal S2. Here, the first signal lines 41 may transmit the first driving signal S1 to the second pixels 30 in the 2N−1 pixel columns among the plurality of second pixels 30 and to the first pixels 20. Further, the second signal lines 42 may transmit the second driving signal S2 to the second pixels 30 in the 2N pixel columns among the plurality of second pixels 30 and to the first pixels 20. Therefore, the first pixels 20 may be connected to the second signal lines 42 as well as the first signal line 41. Further, the first pixels 20 may be driven based on a combination of the first driving signal S1 and the second driving signal S2.

Figure 10:
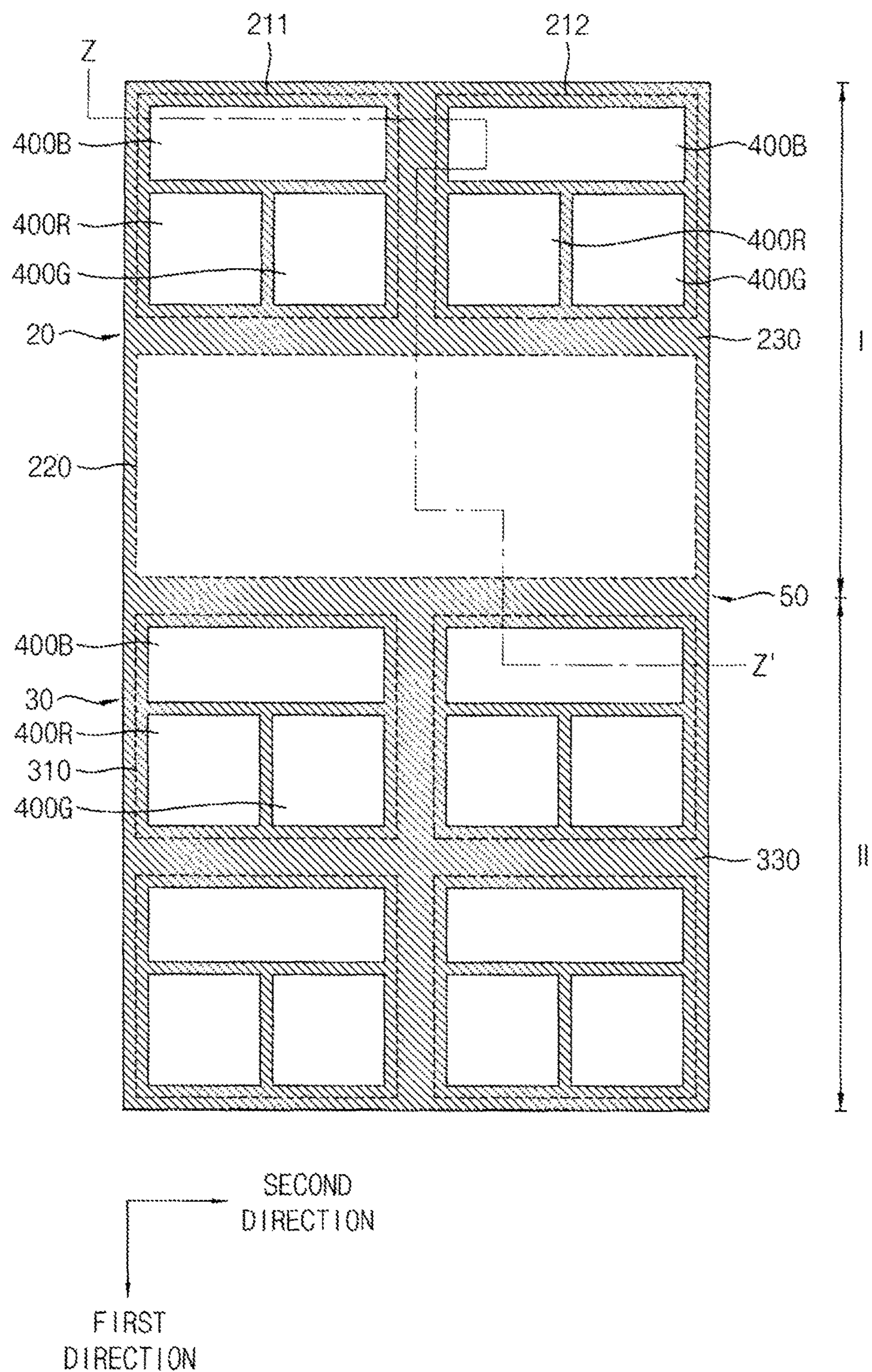
FIG. 10 is a plan view illustrating still another example of an area X in FIG. 1.
Figure 11:
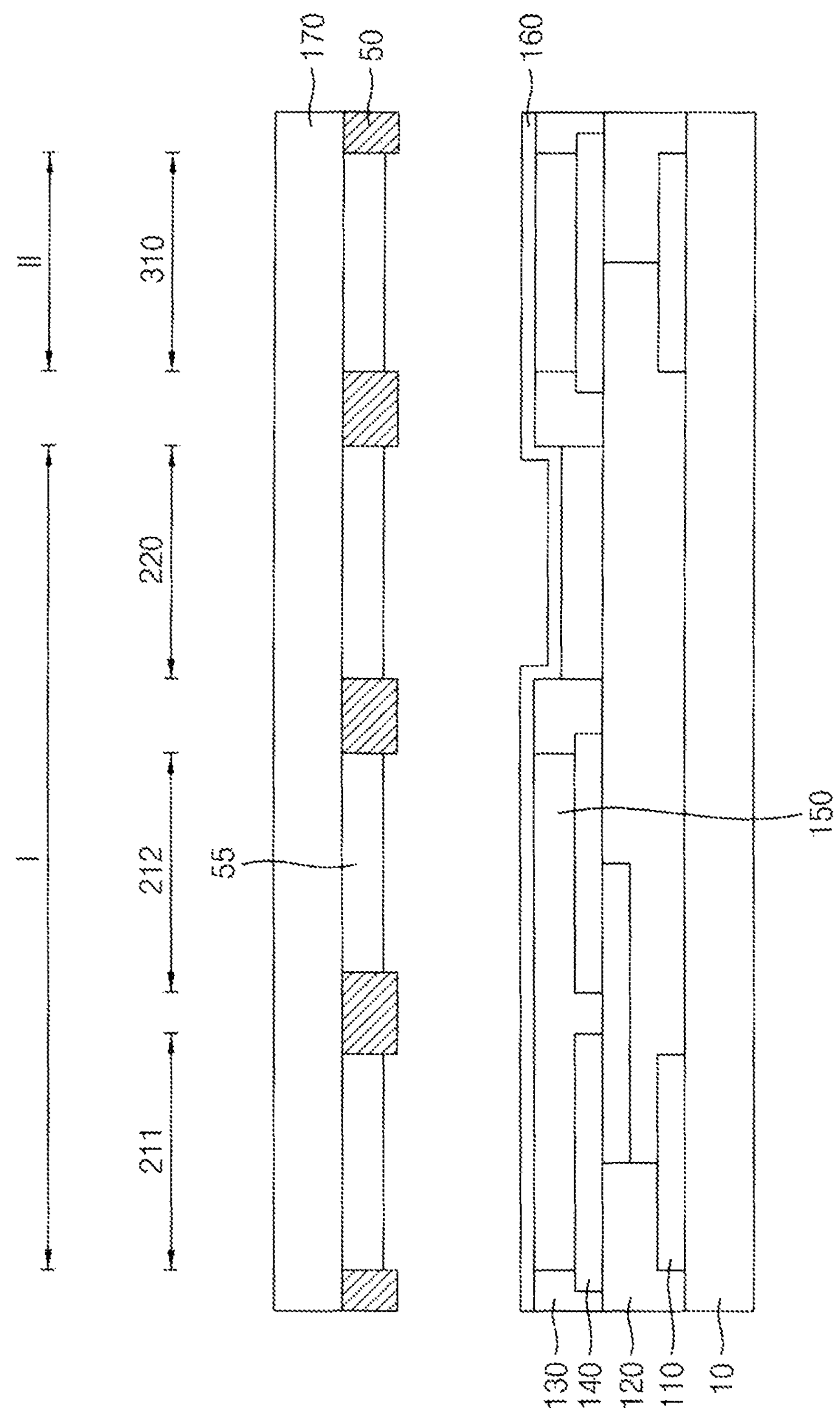
FIG. 11 is a cross-sectional view illustrating an OLED panel cut along a line Z-Z' in FIG. 10.

FIG. 10 is a plan view illustrating still another example of an area X in FIG. 1. FIG. 11 is a cross-sectional view illustrating an OLED panel 1 cut along a line Z-Z' in FIG. 10.

Referring to FIGS. 10 and 11, a first peripheral region 230 surrounding the first unit pixel 211, the second unit pixel 212, and the transmission portion 220 may be defined in the first region I, and a second peripheral region 330 surrounding the third unit pixel 310 may be defined in the second region II.

The OLED panel 1 illustrated in FIGS. 10 and 11 may have elements and/or constructions substantially the same as or similar to the OLED panel 1 illustrated in FIGS. 2 and 4 except for the addition of a light shielding member 50 and a color filter 55. Therefore, detailed descriptions of the repeated elements and/or constructions are omitted, and like reference numerals are used to designate like elements.

In an exemplary embodiment, the light shielding member 50, a shaded portion in FIG. 10, may be formed over the common electrode 160 in the first peripheral region 230 and the second peripheral region 330. In an embodiment, the light shielding member 50 may be formed on one surface of the encapsulation substrate 170 which faces the substrate 10. For example, the light shielding member 50 may overlap the pixel defining layer 130. The light shielding member 50 may block external light incident onto the first region I and the second region II of the OLED panel 1.

The color filter 55 may be formed on the encapsulation substrate 170 to correspond to the pixel electrode 140 formed in each of the first unit pixel 211, the second unit pixel 212, and the third unit pixel 310. For example, the color filter 55 may correspond to each of the first to third sub-pixels 400B, 400R, and 400G. Light emitted from the organic light emitting layer 150 may travel to a front surface of the OLED panel 1 through the color filter 55.

The light shielding member 50 may be disposed in the first peripheral region 230 and the second peripheral region 330, so that contrast of an image displayed in the first region I and the second region II of the OLED panel 1 may be improved.

Figure 12:
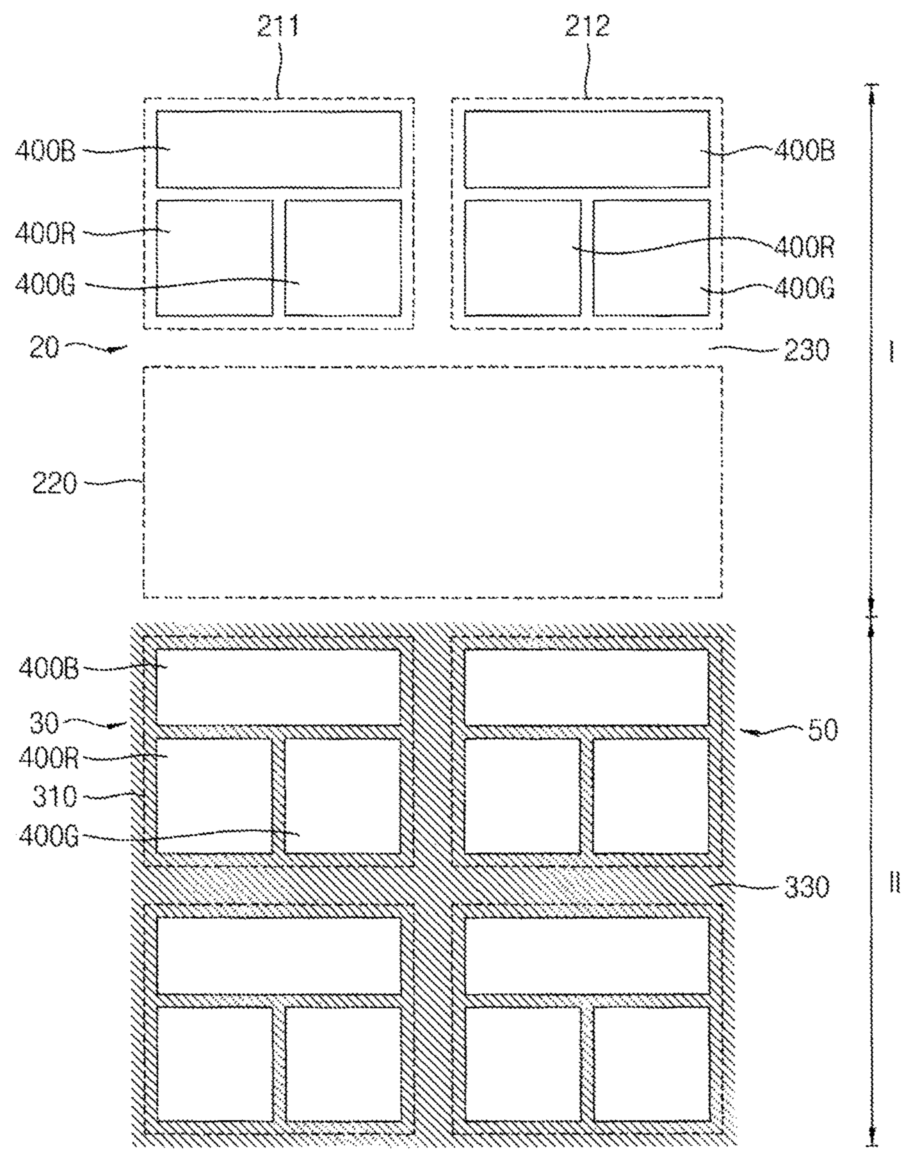
FIG. 12 is a plan view illustrating still another example of an area X in FIG. 1.
Figure 12:
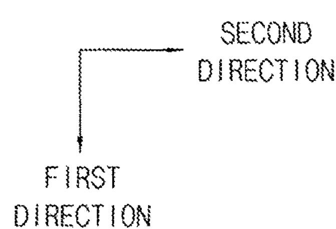

FIG. 12 is a plan view illustrating still another example of an area X in FIG. 1.

The OLED panel 1 illustrated in FIG. 12 may have elements and/or constructions substantially the same as or similar to the OLED panel 1 illustrated in FIGS. 10 and 11 except for the structure of the light shielding member 50. Therefore, detailed descriptions of the repeated elements and/or constructions are omitted, and like reference numerals are used to designate like elements.

Referring to FIG. 12, the light shielding member 50 may be formed over the common electrode 160 in the second peripheral region 330. The light shielding member 50 illustrated in FIG. 12 may not be formed in the first peripheral region 230, and may be formed only in the second peripheral region 330 different from the light shielding member 50 illustrated in FIG. 10. The light shielding member 50 may block external light incident onto the second region II of the OLED panel 1. Therefore, contrast of an image displayed in the second region II of the OLED panel 1 may be improved.

Figure 13:
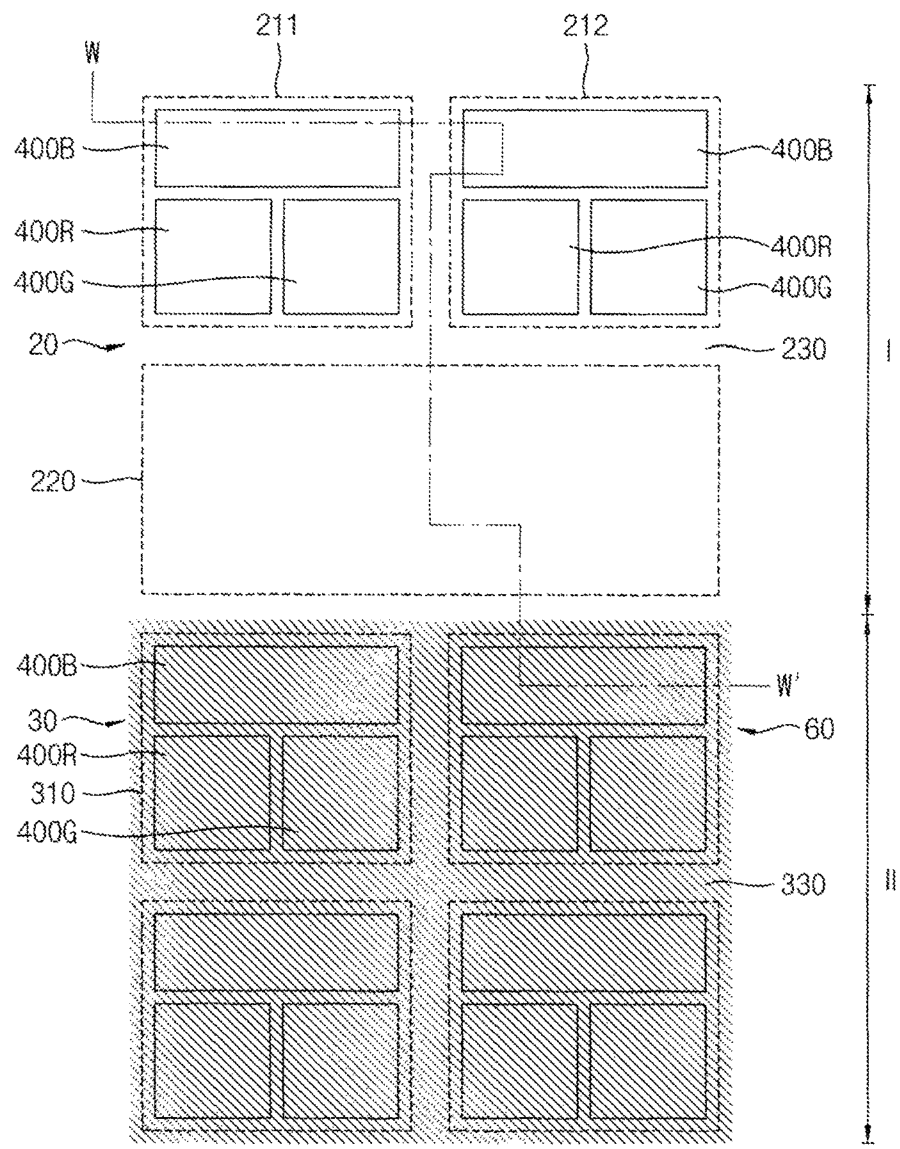
FIG. 13 is a plan view illustrating still another example of an area X in FIG. 1.
Figure 13:
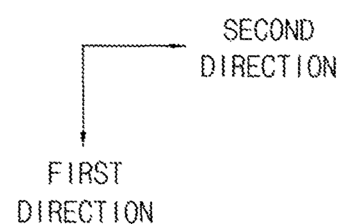
Figure 14:
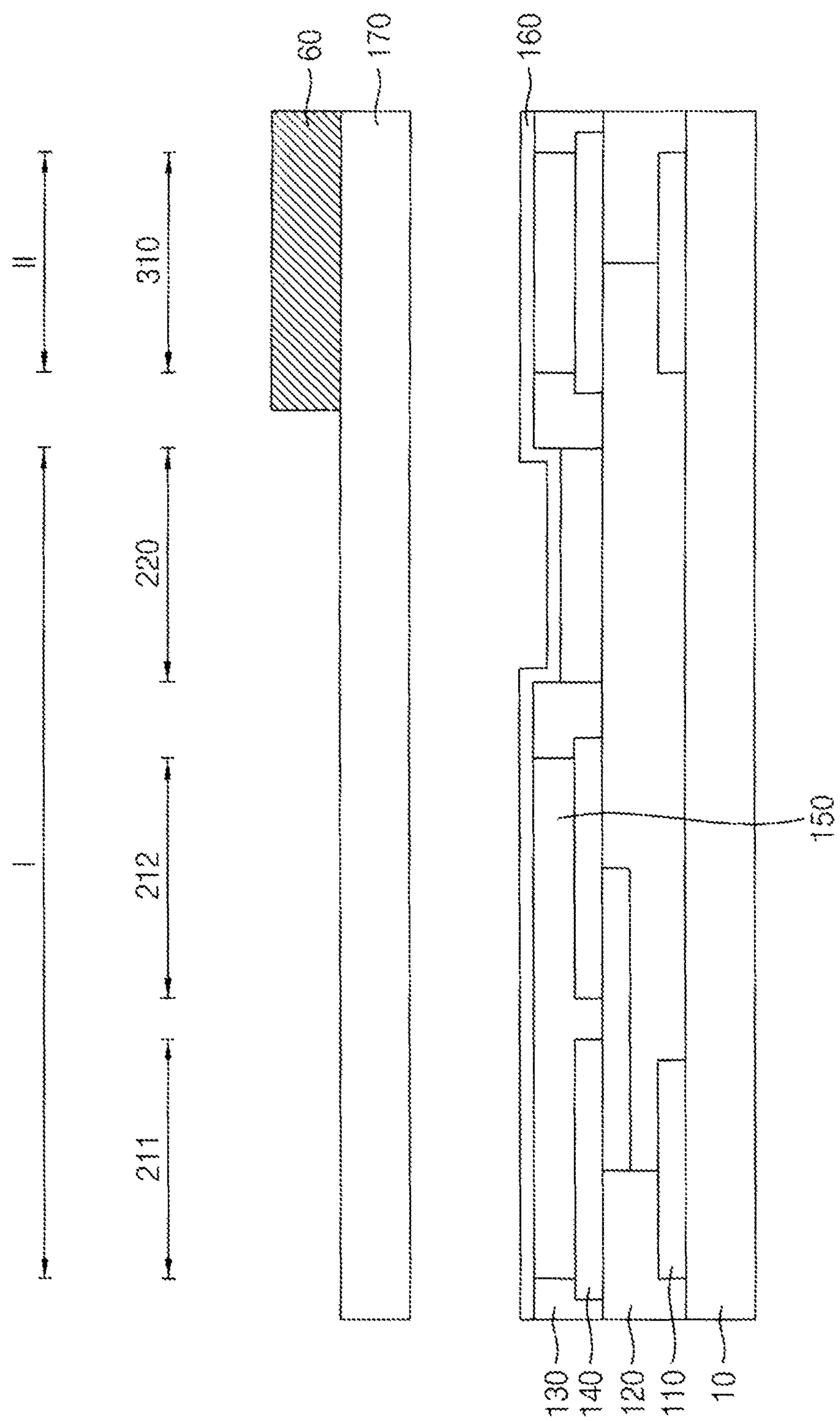
FIG. 14 is a cross-sectional view illustrating an OLED panel cut along a line W-W' in FIG. 13.

FIG. 13 is a plan view illustrating still another example of an area X in FIG. 1. FIG. 14 is a cross-sectional view illustrating an OLED panel 1 cut along a line W-W' in FIG. 13.

Referring to FIGS. 13 and 14, the OLED panel 1 may include the first region I including the plurality of first pixels 20 and the second region II including a plurality of second pixels 30. For example, the first region I may be a low resolution region, and the second region II may be a high resolution region. Further, the first region I may be a transparent region in which a user may observe an object disposed on an opposite side through transmitted external light, and the second region II may be an opaque region in which the external light may be blocked.

The OLED panel 1 illustrated in FIGS. 13 and 14 may have elements and/or constructions substantially the same as or similar to the OLED panel 1 illustrated in FIGS. 2 and 4 except for the addition of a polarizing member 60. Therefore, detailed descriptions of the repeated elements and/or constructions are omitted, and like reference numerals are used to designate like elements. For convenience of the illustration, the illustration of the organic light emitting layer 150 may be omitted in FIG. 13.

In an exemplary embodiment, the polarizing member 60 may be formed over the common electrode 160 in the second region II. In an embodiment, the polarizing member 60 may be formed on a surface opposite to one surface of the encapsulation substrate 170 which faces the substrate 10. For example, the polarizing member 60 may overlap an entirety of the second region II. The polarizing member 60 may prevent the reflection of external light at a front surface of the OLED panel 1.

In an embodiment, the polarizing member 60 may be formed in the second region II, and may not be formed in the first region I. The transmission portion 220 disposed in the first region I may transmit external light. Therefore, if the polarizing member 60 was formed in the first region I, a user may not correctly recognize an object disposed on an opposite side if external light incident onto a bottom surface of the OLED panel 1 passes through the polarizing member 60 through the transmission portion 220. Thus, the polarizing member 60 may not be formed in the first region I thereby preventing a reduction of light transmittance of the external light in the first region I.

The polarizing member 60 may be disposed in the second region II, so that the reflection of the external light may decrease in the second region II of the OLED panel 1, and the visibility of the OLED panel 1 may be improved.

Figure 15:
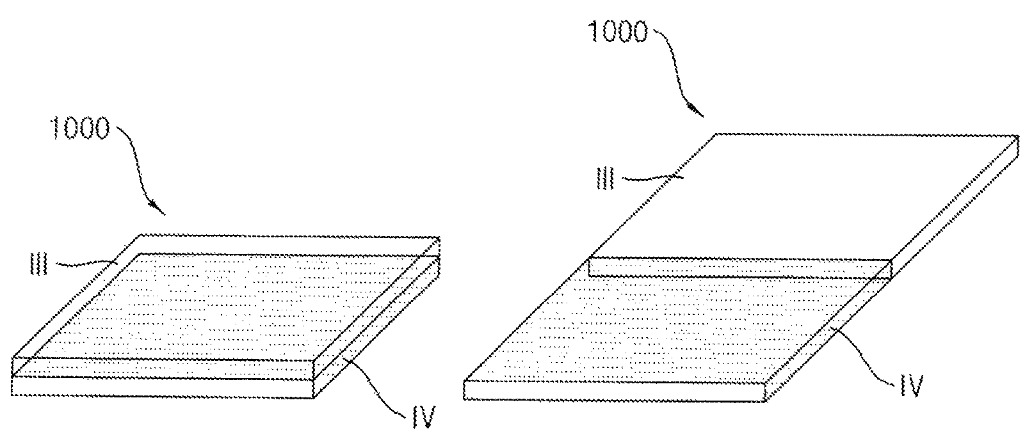
FIG. 15 is a perspective view illustrating a display device including an OLED panel according to exemplary embodiments.

FIG. 15 is a perspective view illustrating a display device 1000 including an OLED panel according to exemplary embodiments.

Referring to FIG. 15, the display device 1000 may include a third region III and a fourth region IV. The third region III may be a transparent region through which external light may pass, and the fourth region IV may be a opaque region through which external light may not pass. The display device 1000 may be a flexible display device which may be folded or bended. For example, the display device 1000 may be folded or bended at a boundary between the third region III and the fourth region IV.

The display device 1000 may include the OLED panel 1 described with reference to FIGS. 1, 2, 4, etc. For example, the substrate 10 and the encapsulation substrate 170 of the OLED panel 1 may include a flexible substrate. The third region III and the fourth region IV may correspond to the first region I and the second region II of the OLED panel 1, respectively.

When the display device 1000 is unfolded, a user may watch an object disposed on an opposite side as well as an image displayed from the display device 1000 through the third region III, and may watch an image with a high resolution through the fourth region IV. Further, when the display device 1000 is folded to overlap the third region III with the fourth region IV, a user may watch an image with a high resolution displayed from the fourth region IV through the transparent third region III.

The OLED panel according to exemplary embodiments may be applied to a display device included in a computer, a notebook, a mobile phone, a smartphone, a smart pad, a PMP, a PDA, an MP3 player, or the like.

Although the OLED panel according to the exemplary embodiments has been described with reference to the drawings, the illustrated embodiments are an example, and may be modified and changed by a person having ordinary knowledge in the relevant technical field without departing from the technical spirit of the inventive concept described in the following claims.

What is claimed is:

1. An organic light emitting display (OLED) panel, comprising:
- a substrate comprising a first region and a second region disposed along a first direction;
- a plurality of first pixels disposed in the first region on the substrate, wherein each of the plurality of first pixels has a first area and comprises a first unit pixel, a second unit pixel disposed in a second direction perpendicular to the first direction from the first unit pixel, and a transmission portion disposed in the first direction from the first unit pixel and the second unit pixel; and
- a plurality of second pixels disposed in the second region on the substrate, wherein each of the plurality of second pixels has a second area less than the first area and comprises a third unit pixel,
- wherein the first unit pixel, the second unit pixel, and the third unit pixel have a same shape as each other, and
- each of the plurality of second pixels excludes the transmission portion.

2. The OLED panel of claim 1, wherein the first unit pixel and the second unit pixel share a pixel circuit.

3. The OLED panel of claim 1, wherein each of the first unit pixel, the second unit pixel, and the third unit pixel comprises a first sub-pixel, a second sub-pixel, and a third sub-pixel.

4. The OLED panel of claim 3, wherein the second sub-pixel and the third sub-pixel are disposed along the first direction from the first sub-pixel and arranged along the second direction.

5. The OLED panel of claim 4, wherein the first sub-pixel, the second sub-pixel, and the third sub-pixel are a blue sub-pixel, a red sub-pixel, and a green sub-pixel, respectively.

6. The OLED panel of claim 1, wherein the first area is four times greater than the second area.

7. The OLED panel of claim 6, wherein an area of the transmission portion is equal to a sum of an area of the first unit pixel and an area of the second unit pixel.

8. The OLED panel of claim 6, wherein an area of the transmission portion is greater than a sum of an area of the first unit pixel and an area of the second unit pixel.

9. The OLED panel of claim 1, further comprising:
- a first signal line extending along the first direction, the first signal line being connected to second pixels in 2N−1 pixel columns among the plurality of second pixels and configured to transmit a first driving signal; and
- a second signal line extending along the first direction, the second signal line being connected to second pixels in 2N pixel columns among the plurality of second pixels and configured to transmit a second driving signal, where N is an integer.

10. The OLED panel of claim 9, wherein the first signal line is connected to the plurality of first pixels,
- wherein the plurality of first pixels are configured to be driven based on the first driving signal.

11. The OLED panel of claim 9, wherein the first signal line and the second signal line are connected to the plurality of first pixels,
- wherein the plurality of first pixels are configured to be driven based on the first driving signal and the second driving signal.

12. The OLED panel of claim 1, wherein a shielding member is disposed in a first peripheral region surrounding the first unit pixel, the second unit pixel, and the transmission portion and in a second peripheral region surrounding the third unit pixel.

13. The OLED panel of claim 1, wherein a polarizing member is disposed in the second region.

14. An organic light emitting display (OLED) panel, comprising:
- a substrate comprising a first region and a second region disposed along a first direction;
- a plurality of first pixels disposed in the first region on the substrate, wherein each of the plurality of first pixels has a first area and comprises a first unit pixel, a second unit pixel disposed in a second direction perpendicular to the first direction from the first unit pixel, and a transmission portion disposed in the first direction from the first unit pixel and the second unit pixel;
- a plurality of second pixels disposed in the second region on the substrate, wherein each of the plurality of second pixels has a second area less than the first area and comprises a third unit pixel;
- a pixel electrode disposed in each of the first unit pixel, the second unit pixel, and the third unit pixel;

a common electrode facing the pixel electrode; and an organic light emitting layer disposed between the pixel electrode and the common electrode, the organic light emitting layer disposed corresponding to each of the first unit pixel, the second unit pixel, the third unit pixel, and the transmission portion, wherein the organic light emitting layer disposed corresponding to each of the first unit pixel, the second unit pixel, the third unit pixel, and the transmission portion includes a same material.

15. The OLED panel of claim 14, wherein each of the first unit pixel, the second unit pixel, and the third unit pixel comprises a first sub-pixel, a second sub-pixel, and a third sub-pixel, wherein the pixel electrode is disposed corresponding to each of the first sub-pixel, the second sub-pixel, and the third sub-pixel, wherein the organic light emitting layer is disposed corresponding to each of the first sub-pixel, the second sub-pixel, and the third sub-pixel.

16. The OLED panel of claim 15, wherein the second sub-pixel and the third sub-pixel are disposed along the first direction from the first sub-pixel and arranged along the second direction, wherein the organic light emitting layer disposed corresponding to each of the first sub-pixel of the first unit pixel and the first sub-pixel of the second unit pixel is integrally formed.

17. The OLED panel of claim 16, wherein the pixel electrode disposed corresponding to each of the first sub-pixel of the first unit pixel and the first sub-pixel of the second unit pixel is integrally formed.

18. The OLED panel of claim 14, wherein the organic light emitting layer disposed corresponding to each of the first unit pixel, the second unit pixel, the third unit pixel, and the transmission portion has a same shape.

19. The OLED panel of claim 18, wherein the organic light emitting layer disposed corresponding to each of the first unit pixel, the second unit pixel, the third unit pixel, and the transmission portion is formed by using a same mask.

20. The OLED panel of claim 14, wherein the organic light emitting layer is configured to transmit light.

* * * * *